(12) United States Patent
Chaghooshi et al.

(10) Patent No.: US 10,289,489 B2
(45) Date of Patent: May 14, 2019

(54) UPDATE EFFICIENT CONSENSUS PROTOCOLS FOR ERASURE CODED DATA STORES

(71) Applicant: Western Digital Technologies, Inc., San Jose, CA (US)

(72) Inventors: Arman Fazeli Chaghooshi, La Jolla, CA (US); Lluis Pamies-Juarez, San Jose, CA (US); Cyril Guyot, San Jose, CA (US); Robert Eugeniu Mateescu, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/647,182

(22) Filed: Jul. 11, 2017

(65) Prior Publication Data

US 2019/0018734 A1    Jan. 17, 2019

(51) Int. Cl.
*G06F 3/06* (2006.01)
*G06F 11/10* (2006.01)
*H03M 13/15* (2006.01)

(52) U.S. Cl.
CPC .......... *G06F 11/1076* (2013.01); *G06F 3/064* (2013.01); *G06F 3/067* (2013.01); *G06F 3/0619* (2013.01); *H03M 13/154* (2013.01); *G06F 11/108* (2013.01); *G06F 11/1096* (2013.01)

(58) Field of Classification Search
CPC .... G06F 11/1076; G06F 3/067; G06F 3/0619; G06F 3/064; G06F 11/108; G06F 11/1096; H03M 13/154

USPC .......................................................... 714/770
See application file for complete search history.

(56) References Cited

U.S. PATENT DOCUMENTS

| | | | | |
|---|---|---|---|---|
| 5,864,655 | A * | 1/1999 | Dewey | G06F 11/1076 714/42 |
| 6,996,752 | B2 * | 2/2006 | Hetrick | G06F 11/1092 714/710 |
| 8,103,939 | B2 * | 1/2012 | Torigoe | G06F 11/108 714/6.24 |
| 8,443,264 | B2 * | 5/2013 | Suganuma | G06F 11/1076 714/770 |

(Continued)

OTHER PUBLICATIONS

International Search Report and Written Opinion, PCT/US2018/020814, dated May 30, 2018, pp. 1-13.

(Continued)

*Primary Examiner* — James C Kerveros
(74) *Attorney, Agent, or Firm* — Patent Law Works LLP

(57) ABSTRACT

Technology is provided for updating a data set at a data storage system. In an example storage system, the system stores a data set in a plurality of data storage devices. The system stores parity data at a plurality of parity devices. The system receives update data from a client system for a first section of the data set. The system generates updated parity data based on an original version of the first section of the data set and the update data. The system transmits update parity data to the plurality of parity devices. The system receives update notifications from a plurality of parity devices. The system determines that update notifications have been received from at least a threshold number of parity devices in the plurality of parity devices. In response, the system updates the first section of the data set at the leader data storage device.

20 Claims, 4 Drawing Sheets

(56) References Cited

U.S. PATENT DOCUMENTS

| | | | |
|---|---|---|---|
| 8,453,036 B1 * | 5/2013 | Goel | G06F 11/1096 |
| | | | 714/763 |
| 8,549,381 B2 * | 10/2013 | Kitahara | G06F 3/0613 |
| | | | 714/763 |
| 8,549,388 B2 * | 10/2013 | Fukutomi | G06F 11/108 |
| | | | 714/766 |
| 9,230,000 B1 | 1/2016 | Hsieh et al. | |
| 9,838,043 B2 * | 12/2017 | Miyamae | H03M 13/611 |
| 2012/0072811 A1 * | 3/2012 | Fukutomi | G06F 11/108 |
| | | | 714/800 |
| 2013/0110774 A1 | 5/2013 | Shah et al. | |
| 2017/0032010 A1 | 2/2017 | Merriman | |
| 2017/0270176 A1 | 9/2017 | Horowitz et al. | |

OTHER PUBLICATIONS

Paxos (computer science), Wikipedia Page, Jul. 5, 2017. p. 1-9, https://en.wikipedia.org/wiki/Paxi.

* cited by examiner

UPDATE EFFICIENT CONSENSUS PROTOCOLS FOR ERASURE CODED DATA STORES

TECHNICAL FIELD

The present disclosure generally relates to distributed storage systems. In a more particular non-limiting example, the present disclosure relates to using efficient update protocols for erasure coded data stores.

BACKGROUND

The rise in electronic and digital device technology has rapidly changed the way society communicates, interacts, and consumes goods and services. Digital technology enables a variety of electronic devices to be available that can be used for a variety of purposes and are relatively cheap. Specifically, modern electronic devices, such as desktop computers, laptops, smart phones, and tablets, allow a user to have access to a variety of useful applications in many locations. Using such applications results in the generation of a large amount of data. Storing and retrieving the produced data is a significant challenge associated with providing useful applications and devices.

The data generated by online services can be stored at data storage facilities remote from any particular user. As the number of users grows so too does the amount of stored data. One technique to protect such data against loss from failure or error is to generate parity data that allows data to be checked for correctness and restored in the case of device failure. Such data may be coded to reduce the amount of parity data needed for these purposes. However, using coded parity data may result in some inefficiencies during the update process because, even for small updates, a large amount of parity data may be regenerated. As a counter measure, reducing the amount of parity data that needs to be updated for each change in the source data can improve the overall functioning of the data storage system significantly.

SUMMARY

The present disclosure generally relates to update efficient consensus protocols for erasure coded data stores. For instance, the disclosure describes technology capable of storing a data set at a data storage system, the data storage system including a plurality of data storage devices and each data storage device storing a section of the data set, storing original parity data at the data storage system in a plurality of parity devices, the original parity data comprising a plurality of parity data subsections, each parity data subsection associated with a particular section of the data set, receiving, at the data storage system, update data from a client system associated with a first section of the data set, generating, at a leader data storage device, updated parity data based on an original version of the first section of the data set and the update data, transmitting updated parity data to the plurality of parity devices, the updated parity data being associated with a particular parity data subsection, receiving update notifications from a plurality of parity devices, an update notification from a particular parity device indicating that the particular parity device has updated the parity data stored at the particular parity device, wherein updating the parity data comprises replacing a subsection of the original parity data with the updated parity data, determining that update notifications have been received from at least a threshold number of parity devices in the plurality of parity devices; and responsive to determining that update notifications have been received from at least the threshold number of parity devices in the plurality of parity devices, updating the first section of the data set at the leader data storage device based on the update data.

These and other implementations may optionally include one or more of the following features, such as, but not limited to, combining the first section of the data set with the update data; that the threshold number of parity devices is based on a total number of parity devices in the plurality of parity devices, that the threshold number of parity devices is a majority of parity devices in the plurality of parity devices, designating a particular data storage device associated with the first section of the data set as the leader data storage device, identifying one or more data storage devices that store the first section of the data set, selecting a data storage device from the one or more data storage devices that stores the first section of the data set as the leader data storage device, and that the original parity data is coded and can be used to validate the data set.

Other aspects include corresponding methods, systems, apparatus, and computer program products for these and other innovative aspects.

Note that the above list of features is not all-inclusive and many additional features and advantages are contemplated and fall within the scope of the present disclosure. Moreover, the language used in the present disclosure has been principally selected for readability and instructional purposes, and not to limit the scope of the subject matter disclosed herein.

BRIEF DESCRIPTION OF THE DRAWINGS

The present disclosure is illustrated by way of example, and not by way of limitation in the figures of the accompanying drawings in which like reference numerals are used to refer to similar elements.

DETAILED DESCRIPTION

Figure 1:
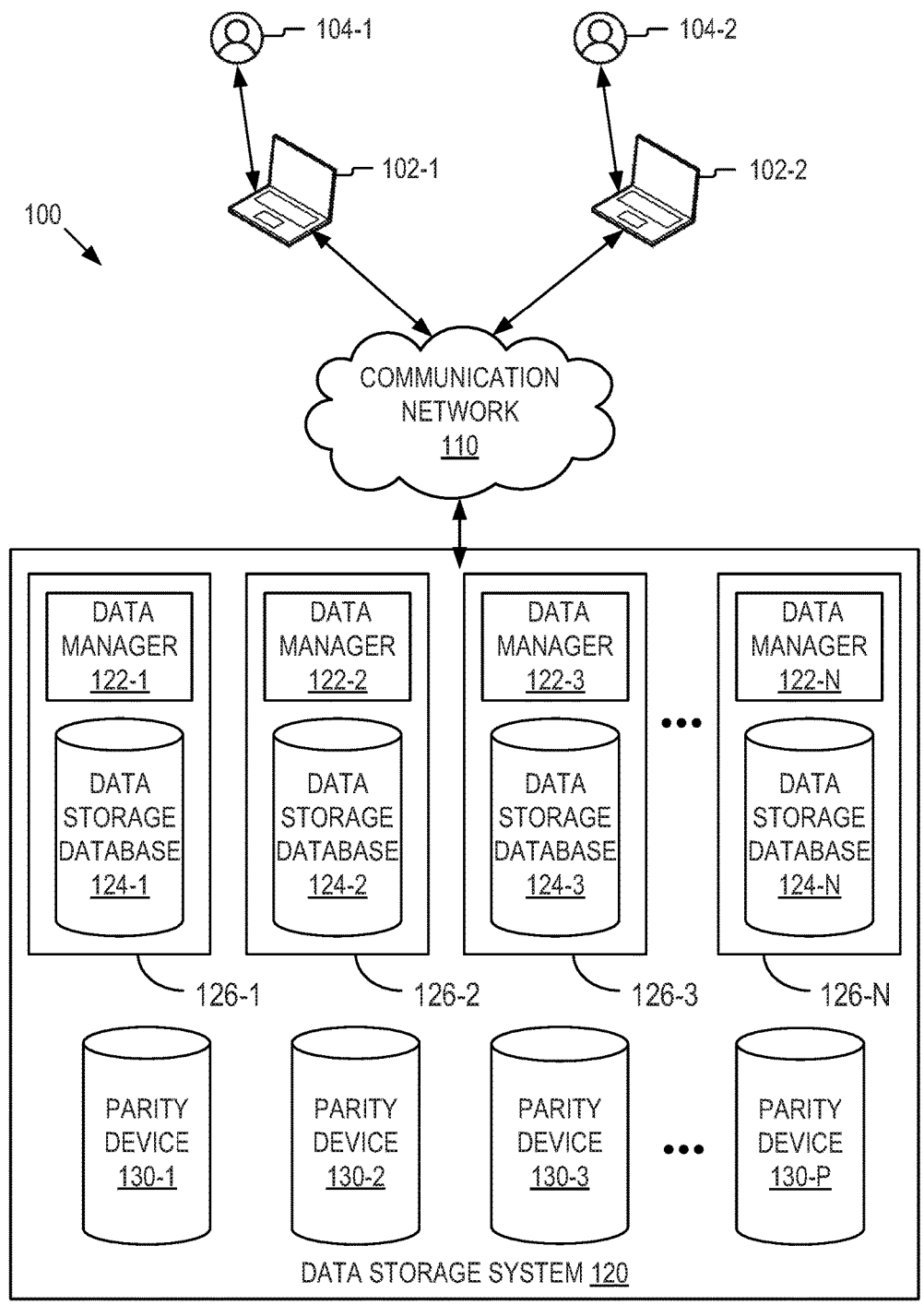
FIG. 1 is a network diagram depicting a client-data storage system environment that includes various functional components of a data storage system, in accordance with some example embodiments.

The present disclosure describes technology, which may include methods, systems, apparatuses, computer program products, and other aspects, for using efficient consensus protocols to update erasure coded data stores. In the following description, for purposes of explanation, numerous specific details are set forth to provide a thorough understanding of the various aspects of different example embodiments. Note that any particular example embodiment may in various cases be practiced without all of the specific details and/or with variations, permutations, and combinations of the various features and elements described herein.

As a non-limiting overview of the technology, a data storage system may be comprised of a plurality of storage devices, each maintaining a portion of a set of data. To minimize the risk of data loss from device failure or error, the data storage system may use erasure coding to store extra data that provides redundancy and data recovery capability. To do so, the data storage system may create parity data that is associated with source data and enables the source data to be checked for accuracy and recovered if lost.

A variety of methods may be used to provide the erasure coding capability. In general, erasure coding begins with stored source data that needs to be preserved from failure or error. Source data may be any data that is stored in the data storage system including, but not limited to, documents, objects, media files, and so on. The data storage system uses coding capability to generate parity data. Parity data is additional data or redundant data, generated based on the source data, that is intended to enable the source data to be checked for correctness recovered if lost. The source data and the parity data together may be referred to as coded data. However, because the coded data may include parity data, the coded data may also be referred to as parity data. Thus, as used herein, parity data may refer to the additional generated data and/or to the coded data.

One example of an erasure coding method is polynomial interpolation (or oversampling). Polynomial interpolation may generate a certain amount of parity data for each section of source data and is described by the following equation:

$$n=k+m$$

In this equation, k represents the source data and m represents the parity data (which is additional or redundant data added to provide protection from failures.) The result is coded data n. Put another way, k symbols are broken into sections, expanded and coded with additional symbols m and stored across multiple media as coded data n. In the case that the source data k is lost, the source data k can be reconstructed using a subset of the symbols of the set n. The ratio between the number of bits needed to store the original block of data k and the number of bits needed store the coded data n, may correlate to the number of failures that the coded data can be recovered from. One example of erasure coding would be a parity bit, which is set to 1 or 0 depending on whether the number of 1's in the associated data is even or odd. This is just an example. Many other erasure coding methods can be used, including much more complicated versions of polynomial interpolation can be used.

In some example embodiments, parity data (e.g., either the portions of data added to enable data recovery or verification or the coded data) may be stored in one or more parity devices distinct from the original data (which is stored in a storage device that is part of the data storage system). The parity data may replicated over a plurality of parity devices to enable quick and efficient recovery in the case of failure or error.

Conventionally, when the original data is changed or updated, the process for updating the parity devices is typically inefficient and time consuming. This is especially true when a small change to the original data results in the replacement/updating of a large amount of parity data. To avoid this inefficient process, the data storage system may implement a protocol that allows only the updated portions of coded data to be replaced.

In some example embodiments, the data storage system receives a data update to a first section of the data stored at the data storage system. The data storage system identifies a storage device that stores the updated section of the data, selects that storage device to be the leader data storage device, and transmits the data update to the selected leader data storage device. Because the leader data storage device stores the original data (e.g., non-coded version of the data), the leader data storage device can generate updated parity data using the original data and the data update, without the need to access data stored on other storage devices.

In some example embodiments, the leader data storage device combines the original data and the data update to generate updated parity data for the data sections that have been updated. This updated parity data is then sent to each of the parity devices. When a particular parity device receives the updated parity data, the parity device updates the portion of the parity data associated with the updated data. This allows only a small fraction of the total parity data to be changed and significantly reduces the size of the requested write operation. Once a particular parity device has updated its own parity data, it transmits an update notification (e.g., an acknowledgement) to the leader data storage device. In some example embodiments, the particular parity device also transmits an update notification to at least one other parity device.

Once the leader data storage device receives update notifications from a threshold number of parity devices (e.g., a quorum), the leader data storage device may update the section of data stored at the leader data storage device based on the update data, thereby committing the update and making it live to users.

FIG. 1 is a network diagram depicting a client-server system environment 100 that includes various functional components of a data storage system 120, in accordance with some example embodiments. Note that when multiple instances of a similar element are depicted they will be labeled with the same reference number followed by a dash ("-") and another number or letter (e.g., 112-3) to designate different instances. In the event a reference numeral appears in the text without a dash and subsequent number or letter, for example, "112," it is used as a general reference to a generic instance of the element or component bearing that general reference numeral. For example, client systems 102-1 and 102-2 are included in FIG. 1, but the reference number 102 may be used to reference a generic client system.

The client-server system environment 100 includes two or more client systems 102-1 and 102-2 and the data storage system 120. One or more communication networks 110 interconnect these components. The communication networks 110 may be any of a variety of network types, including local area networks (LANs), wide area networks (WANs), wireless networks, wired networks, the Internet, personal area networks (PANs), or a combination of such networks.

The client systems 102-1 and 102-2 may include electronic devices, such as a personal computer (PC), a laptop, a smartphone, a tablet, a mobile phone, a wearable electronic device or any other electronic device capable of communication with the communication network 110. The client system 102 may include one or more client applications, which are executed by the client system 102. In some example embodiments, the client applications include one or more applications such as search applications, communication applications, productivity applications, game applications, word processing applications, or any other useful applications. The client applications may include a web browser. A client system 102 may use a web browser to send and receive requests to and from the data storage system 120 and to display information received from the data storage system 120.

A client system (102-1 or 102-2) may be associated with a particular user (104-1 or 104-2) that operates the client system (102-1 or 102-2) and uses one or more client applications installed on the client system 102-1 or 102-2. A client system 102 may include an application specifically customized for communication with the data storage system 120 (e.g., an application associated with the server system).

A client system 102 may send a request to the data storage system 120 to store, update, delete, or retrieve a particular file or files stored at the data storage system 120 through the communication network 110. For example, a user 104 updates a document using a work processing application and wishes to save the updated version to the data storage system 120, the user uses an application on the client system 102 to transmit a request to store the updated version of the document as well as the updated document itself. Similarly, a user may request a particular version of a file or object and receive, from the data storage system 120, the requested version of a file or object.

As shown in FIG. 1, the data storage system 120 may include a plurality of data storage devices 126-1 to 126-N and a plurality of parity devices 130. A data storage device 126-1 to 126-N may include a data manager 122-1 to 122-N and a data storage database 124-1. The data manager 122-1 may receive requests to store or retrieve data, update already stored data, transmit notifications that updates have been stored, and so on. The data storage database 124-1 to 124-N may store a section of a dataset that is spread over the data storage devices 126-1 to 126-N. In some example embodiments, one or more of the data storage devices 126 stores a copy or backup of data also stored at another data storage device 126.

In some example embodiments, one of the data storage devices is selected or designated as having a special status according to which that device coordinates updates among the parity devices 130-1 to 130-P. The selected data storage device 126 with the special status may be referred to herein as the "leader data storage device." The leader data storage device may be selected because it stores the section of the data set that is associated with a received data update.

Thus, when the data storage system 120 receives a data update, it may determine which data storage device 126 stores the section of data associated with the data update. The designated leader data storage device (e.g., one of the data storage devices 126-1 to 126-N) may then generate updated parity data based on the received data update. The leader data storage device may then transmit the updated parity data to the plurality of parity devices 130-1 to 130-P.

The plurality of parity devices (130-1 to 130-N) store parity data that allows errors in the data storage databases (124-1 to 124-N) to be repaired or recovered in the event of an error or failure. A variety of different types of parity data may be used to provide fault recovery capability. For example, one version of parity data may be a single data bit that represents whether the number of bits in a given block of data is either odd or even. In another example, the parity data is generated by using an exclusive-or, or XOR, method. Exclusive-or is a Boolean logic function that resolves as true (e.g., a 1 value) if one of two inputs is true but not both. An XOR of two or more of the data devices in the data storage system 120 are written to a particular parity device. If one of the data storage devices fails, the XOR of the remaining devices is identical to the data of the lost device. Therefore, when a device is lost, recovering the data may be recovered by copying the XOR of the remaining devices to a fresh data device.

When the parity devices 130 receive updated parity data from the leader data storage device, each parity device 130 updates the specific portion of parity data that is being updated. Once a particular parity device updates the data stored at that particular parity device, it may send an update notification to the leader data storage device. When the leader data storage device (e.g., one of 126-1 to 126-N) receives update notifications from a threshold number of parity drives, the leader data storage device may update the original data stored in its associated data storage database 124, thus committing the data update.

Figure 2:
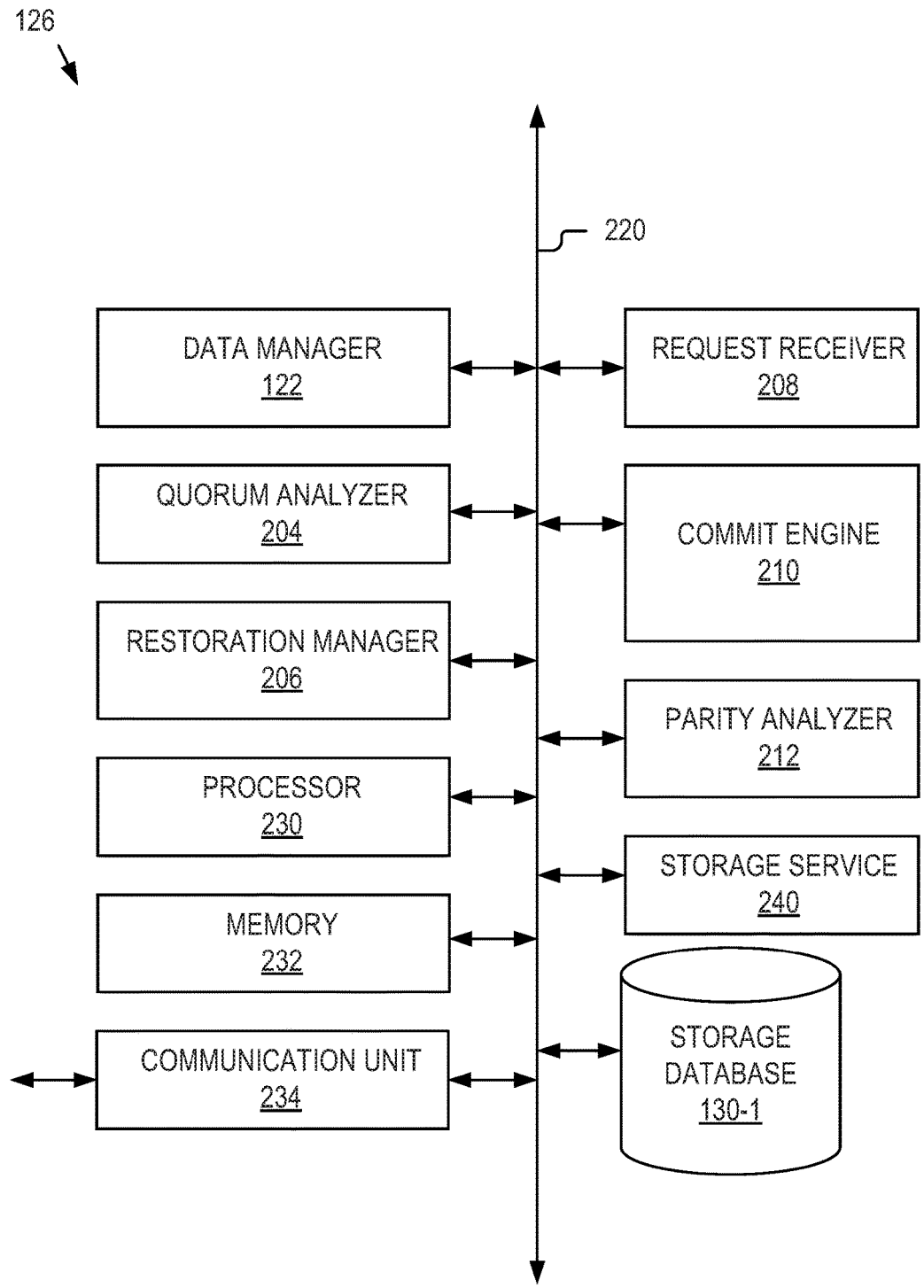
FIG. 2 is a block diagram of an example data storage device.

FIG. 2 is a block diagram of an example data storage device 126. While the data storage device 126 is shown as a single system or machine, it is appreciated that the acts and/or functionality described with respect to the data storage device 126 may be embodied in a plurality of different computing devices connected over a wide geographic area. Thus, while the functionality of data storage device 126 may be split amongst more than one computer device, for simplicity in description, the functionality is often described as a single system and thus is illustrated as such in this description.

The data storage device 126 may include a processor 230, memory 232, a communication unit 234, a storage service 240, a data manager 122, a quorum analyzer 204, a restoration manager 206, a request receiver 208, a commit engine 210, a parity analyzer 212, and a data storage database 124. In some implementations, the components of the data storage device 126 are communicatively coupled by a bus 220.

The processor 230 includes an arithmetic logic unit, a microprocessor, a general-purpose controller, or some other processor array to perform computations and provide electronic display signals to a display device. The processor 230 is coupled to the bus 220 for communication with the other components. Processor 230 processes data signals and may include various computing architectures including a complex instruction set computer (CISC) architecture, a reduced instruction set computer (RISC) architecture, or an architecture implementing a combination of instruction sets. Although FIG. 2 depicts a single processor 230, multiple processors may be encompassed by the processor 230. Further processors, operating systems, sensors, displays and physical configurations are possible.

The memory 232 includes one or more non-transitory computer-readable media. The memory 232 stores instructions and/or data that may be executed by the processor 230. The memory 232 is coupled to the bus 220 for communication with the other components. The instructions and/or data may include code for performing the techniques described herein. The memory 232 may be a dynamic random-access memory (DRAM) device, a static random-access memory (SRAM) device, flash memory, or some other memory device. In some instances, the memory 232 also includes a non-volatile memory or similar permanent storage device and media including a hard disk drive, a floppy disk drive, a CD ROM device, a DVD ROM device, a DVD RAM device, a DVD RW device, a flash memory device, or some other mass storage device for storing information on a more permanent basis.

The communication unit 234 transmits and receives data to and from the network 110. The communication unit 234 is coupled to the bus 220. In some instances, the communication unit 234 includes a port for direct physical connection to the network 110 or to another communication channel. For example, the communication unit 234 includes a USB, SD, CAT-6 or similar port for wired communication with the network 110. In some instances, the communication unit 234 includes a wireless transceiver for exchanging data with the network 110 or other communication channels using one or more wireless communication methods, including IEEE 802.11, IEEE 802.16, BLUETOOTH® or another suitable wireless communication method. Although FIG. 2 includes a communication unit 234, multiple communication units 234 may be included.

In some instances, the communication unit 234 includes a cellular communications transceiver for sending and receiving data over a cellular communications network including via short messaging service (SMS), multimedia messaging service (MMS), hypertext transfer protocol (HTTP), direct data connection, WAP, e-mail or another suitable type of electronic communication. In some instances, the communication unit 234 includes a wired port and a wireless transceiver. The communication unit 234 also provides other connections to the network 110 for distribution of files and/or media objects using network protocols including TCP/IP, HTTP, HTTPS, SSL, SMTP, and so on.

The storage service 240 can include software including routines for storing and retrieving data from the data storage database 124 under the direction of the data manager. The data storage database 124 includes a data set and an indication of whether the current data is provisional or not. In some instances, the data storage database 124 is implemented on a plurality of possible storage devices including but not limited to a non-volatile memory or similar permanent storage device and media including a hard disk drive, a floppy disk drive, a CD ROM device, a DVD ROM device, a DVD RAM device, a DVD RW device, a flash memory device, or some other mass storage device for storing information on a more permanent basis.

In the implementation shown in FIG. 2, the data storage device 126 includes a data manager 122. The data manager 122 receives a request to store or retrieve one or more portions of data in a stored data set. The data manager 122, when acting as a leader data storage device, receives instructions to write an update based on update data. The leader data storage device may generate updated parity data based on the original data and the update data. The leader data storage device transmits the updated parity data to one or more parity devices 130.

The data manager 122 may also receive update notifications from parity devices 130 as they update the parity data that they store. Once a threshold number of update notifications have been received, the data manager 122 will update the data at the leader data storage device based on the update data.

A quorum analyzer 204 may determine a threshold number of update notifications that, once received, constitutes a quorum and results in making the update in data stored at the data storage database 124. In some example embodiments, the threshold is a simple majority. In other embodiments, the threshold number is determined as a percentage of total parity devices 130. In some example embodiments, the restoration manager 206 enables the data storage device 126 to repair incorrect or faulty data using coded parity data stored in a parity device 130.

In some example embodiments, a request receiver 208 receives a request for data from a client system 102. In some example embodiments, the request receiver 208 may also receive data update requests, requests to provide backup data for a failed data storage device, and update notifications from replica devices.

In some example embodiments, a commit engine 210 tracks a number of update notifications received by the data storage device 126 and, when a threshold number has been reached, commits the data as the current version of the data set for any future data retrieval requests. In some example embodiments, the parity analyzer 212 uses parity data stored on one or more parity devices 130 to authenticate the stored data and ensure that no errors have occurred.

Figure 3:
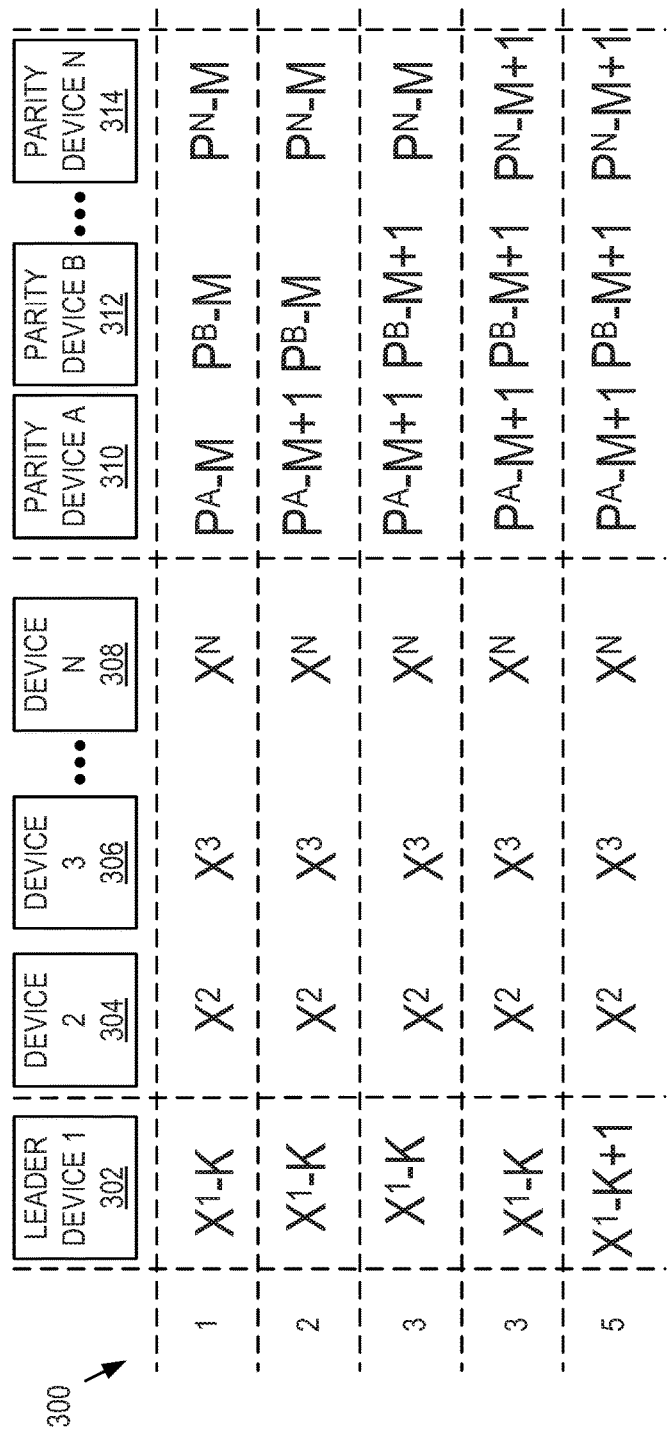
FIG. 3 is a diagram representing the state of one or more storage devices and parity devices through a data update process, in accordance with some example embodiments.

FIG. 3 is a diagram 300 representing the state of one or more storage devices and parity devices through a data update process, in accordance with some example embodiments. The section of the data set stored on a leader device 1 302, a plurality of storage devices (304-308), and a plurality of parity devices (310-314) are represented through a series of update steps. In this example, the leader device 1 302 may coordinate updating the parity data on the plurality of parity devices 310-314) which store coded data that enables data correction or restoration in the case of a device failure.

In step one, the leader device 1 302 stores a first section of a data set $X^1$ on version K, represented as $X^1$-K, wherein K represents the version indicator. The storage devices 304-308 store other portions of the data set (represented as $X^2$, $X^3$, and $X^n$ respectively). The parity devices (310-314) store parity data associated with the first version of the data set (represented as $P^A$-M-$P^N$-M and wherein M represents the version indicator). The leader device 302 may then receive an update (e.g., a write operation which will result in an updated version of the first section of the data set ($X^1$-K+1)).

In some example embodiments, the leader device 302 generates update parity data and sends it to the parity devices (410 to 414). One example method of creating updated parity data (represented as $P^A$-M+1) is by combining the original source data $X^1$-K with the updated source data ($X^1$-K+1). In some example embodiments, the specific contents of the update parity data are dependent on how the erasure coding capability is implemented.

In step two, parity device A 310 has updated its parity data. The updated parity data is represented as $P^A$-M+1. Parity device 1 310 may then send an update message (acknowledgement) to the leader device 1 302.

In step three, parity device 2 312 has updated its parity data to the updated parity data, represented as $P^B$-M+1. Parity device B 312 may then send an update message (acknowledgement) to the leader device 1 302. Similarly, in step four, parity N 314 has updated its parity data to the updated parity data, represented as $P^N$-M+1. Parity N 314 may then send an update message (acknowledgement) to the leader device 1 302.

In step five, after the leader device 1 302 has received update notifications or acknowledgement from a threshold number of parity devices (e.g., more than half), the leader device 1 302 then updates the data stored at its data storage database 124 to updated version of the first section of the data set ($X^1$-K+1). The update may then be considered committed and live to access for users. Also note, that only the affected section of the data set stored at leader device 1 is updated. Thus, the other sections of the data set stored on other devices and parity data associated with those other sections do not need to be updated. This was the advantage that when only data associated with the leader device 1 302 is updated, the data storage system 120 only updates the subset of data on the parity devices corresponding to data associated with X'.

Figure 4:
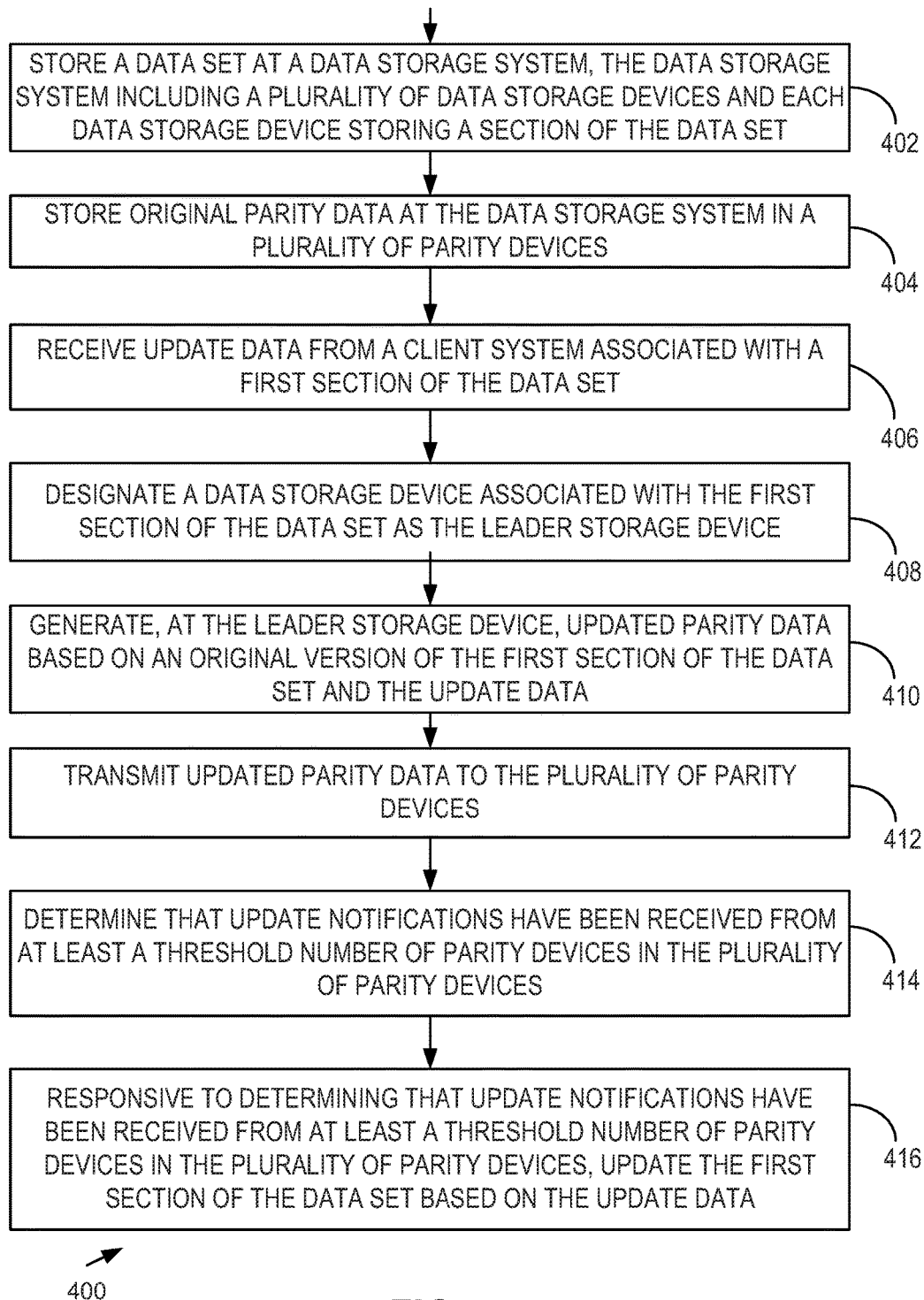
FIG. 4 is a flow charts of an example method for using efficient consensus protocols to update erasure coded data stores.

FIG. 4A is a flow chart of an example method 400 for using efficient consensus protocols to update erasure coded data stores. The operations shown in FIG. 4A may correspond to instructions stored in a computer memory or one or more computer-readable storage media. In some embodiments, the method described in FIG. 4A is performed by the data storage system (e.g., data storage system 120 in FIG. 1).

The method illustrated by the figure is performed on or by a data storage system (e.g., data storage system 120 in FIG. 1) including one or more processors and memory storing one or more programs for execution by the one or more processors.

In some example embodiments, the data storage system (e.g., data storage system 120 in FIG. 1) may include a plurality of data storage devices and each data storage device storing a section of the data set. The data storage system 120 may store (404) original parity data at a plurality of parity devices. In some example embodiments, the original parity data is coded and can be used to validate the correctness of the data set.

In some example embodiments, the stored coded data allows the data storage service to recover data if a storage device fails, is corrupted, or has a data error. The data storage system may provide parity functionality using many different methods. For example, parity device data may take many forms such as a single bit for a block of data indicating whether the number of bits is even or odd. More sophisticated parity data may use an "exclusive-or" (XOR) function to generate exclusive or data from a plurality of devices. If one of the devices fails, the XOR data can be used to restore the failed device.

The data storage system (e.g., data storage system 120 in FIG. 1) receives (406) update data from a client system associated with a first section of the data set. In some example embodiments, the data storage system (e.g., data storage system 120 in FIG. 1) designates (408) a data storage device associated with the first section of the data set as the leader data storage device. For example, when a write operation is requested, the data storage system (e.g., data storage system 120 in FIG. 1) determines which data storage device 126 stores the section of the data set associated with the data update. In some example embodiments, there are multiple replicas of each section at a plurality of data storage systems and the data storage system (e.g., data storage system 120 in FIG. 1) may choose any matching data storage device 126.

The data storage system (e.g., data storage system 120 in FIG. 1) may generate (410), at the leader data storage device, updated parity data based on an original version of the first section of the data set and the update data. In some example embodiments, generating, at the leader data storage device, updated parity data further comprises combining the first section of the data set with the update data.

For example, updated parity data may follow the following basic formula:

$$p_i^j \rightarrow p_{i+1}^j = p_i^j + \alpha_i^j(x_i^1 + x_{i+1}^1)$$

Thus, parity data for section j goes from i to i+1 (the next update) by adding the original parity data ($p_i^j$) to the coded (represented by the symbol $\alpha_i^j$) combination of the data at leader device 1 ($x^1$) and the update to the data at leader device 1 ($x_{i+1}^1$).

In some example embodiments, the parity data includes a plurality of parity data subsections, each parity data subsection being associated with a section of the data set. The data storage system (e.g., data storage system 120 in FIG. 1) may transmit (412) updated parity data to the plurality of parity devices. When a parity device updates its respective parity data based on the updated parity data, its sends an update notification (e.g., an acknowledgement) to the leader data storage device. The data storage system (e.g., data storage system 120 in FIG. 1) may determine that update notifications have been received from at least a threshold number of parity devices in the plurality of parity devices.

In some example embodiments, the threshold number of parity devices is based on a total number of parity devices in the plurality of parity devices. In some example embodiments, the threshold number of parity devices is a majority of parity devices in the plurality of parity devices. In some example embodiments, the updated parity data is associated with a particular parity data subsection and updating the parity devices includes replacing a subsection of the original parity data.

Responsive to determining that update notifications have been received from at least a threshold number of parity devices in the plurality of parity devices, the data storage system (e.g., data storage system 120 in FIG. 1) may update (416) the first section of the data set based on the update data.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in enough detail to enable the disclosed teachings to be practiced. Other embodiments may be used and derived therefrom, such that structural and logical substitutions and changes may be made without departing from the scope of this disclosure. The Detailed Description, therefore, is not to be taken in a limiting sense, and the scope of various embodiments is defined by the below claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. The illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others to best utilize the various example embodiments with various modifications as are suited to the particular use contemplated.

Note that, although the terms "first," "second," and so forth may be used herein to describe various elements, these elements are not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for describing particular example embodiments only and is not intended to be limiting. As used in the description of the example embodiments and the appended claims, the singular forms "a," "an," and "the" are intended to include the plural forms as well, unless the context clearly indicates otherwise. Also note that the term "and/or" as used herein refers to and encompasses any and/or all possible combinations of one or more of the associated listed items. Furthermore, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

What is claimed is:

1. A computer-implemented method comprising:
    storing a data set at a data storage system, the data storage system including a plurality of data storage devices, wherein each data storage device of the plurality of data storage devices is configured for:
        storing a section of the data set; and
        generating parity data for the section of the data set stored in the data storage device;
    storing original parity data at the data storage system in a plurality of parity devices, the original parity data comprising a plurality of parity data subsections, each parity data subsection associated with a particular section of the data set;
    receiving, at the data storage system, update data from a client system associated with a first section of the data set;
    generating, at a leader data storage device selected from the plurality of data storage devices, updated parity data based on an original version of the first section of the data set and the update data;
    transmitting the updated parity data to the plurality of parity devices, the updated parity data being associated with a particular parity data subsection;
    receiving update notifications from a plurality of parity devices, an update notification from a particular parity device indicating that the particular parity device has updated the parity data stored at the particular parity device, wherein updating the parity data comprises replacing a subsection of the original parity data with the updated parity data;
    determining that update notifications have been received from at least a threshold number of parity devices in the plurality of parity devices; and
    responsive to determining that update notifications have been received from at least the threshold number of parity devices in the plurality of parity devices, updating the first section of the data set at the leader data storage device based on the update data.

2. The computer-implemented method of claim 1, wherein the threshold number of parity devices is based on a total number of parity devices in the plurality of parity devices.

3. The computer-implemented method of claim 1, wherein the threshold number of parity devices is a majority of parity devices in the plurality of parity devices.

4. The computer-implemented method of claim 1, wherein generating, at the leader data storage device, updated parity data further comprises:
    combining the first section of the data set with the update data.

5. The computer-implemented method of claim 1, further comprising:
    designating a particular data storage device associated with the first section of the data set as the leader data storage device.

6. The computer-implemented method of claim 5, wherein designating a particular data storage device associated with the first section of the data set as a leader data storage device further comprises:
    identifying one or more data storage devices that store the first section of the data set; and
    selecting a data storage device from the one or more data storage devices that stores the first section of the data set as the leader data storage device.

7. The computer-implemented method of claim 1, wherein the original parity data is coded and can be used to validate the data set.

8. A data storage system comprising:
    a plurality of data storage devices, wherein each data storage device of the plurality of data storage devices is configured for:
        storing a section of a data set; and
        generating parity data for the section of the data set stored in the data storage device;
    one or more computer processors; and
    storage logic including a data manager that, when executed by the one or more computer processors, performs operations comprising:
        storing a data set at the data storage system;
        storing original parity data at the data storage system in a plurality of parity devices selected from the plurality of data storage devices, the original parity data comprising a plurality of parity data subsections, each parity data subsection associated with a particular section of the data set;
        receiving, at the data storage system, update data from a client system associated with a first section of the data set;
        generating, at a leader data storage device selected from the plurality of data storage devices, updated parity data based on an original version of the first section of the data set and the update data;
        transmitting the updated parity data to the plurality of parity devices, the updated parity data being associated with a particular parity data subsection;
        receiving update notifications from a plurality of parity devices, an update notification from a particular parity device indicating that the particular parity device has updated the parity data stored at the particular parity device, wherein updating the parity data includes replacing a subsection of the original parity data with the updated parity data;

determining that update notifications have been received from at least a threshold number of parity devices in the plurality of parity devices; and responsive to determining that update notifications have been received from at least the threshold number of parity devices in the plurality of parity devices, updating the first section of the data set at the leader data storage device based on the update data.

9. The data storage system of claim 8, wherein the threshold number of parity devices is based on a total number of parity devices in the plurality of parity devices.

10. The data storage system of claim 8, wherein the threshold number of parity devices is a majority of parity devices in the plurality of parity devices.

11. The data storage system of claim 8, wherein generating, at the leader data storage device, updated parity data further comprises:

combining the first section of the data set with the update data.

12. The data storage system of claim 8, wherein the operations further comprise:

designating a particular data storage device associated with the first section of the data set as the leader data storage device.

13. The data storage system of claim 12, wherein the original parity data is coded and can be used to validate the data set.

14. A system comprising:

means for storing a data set at a data storage system, the data storage system including a plurality of data storage devices, wherein each data storage device of the plurality of data storage devices is configured for:
storing a section of the data set; and
generating parity data for the section of the data set stored in the data storage device;

means for storing original parity data at the data storage system in a plurality of parity devices, the original parity data comprising a plurality of parity data subsections, each parity data subsection associated with a particular section of the data set;

means for receiving, at the data storage system, update data from a client system associated with a first section of the data set;

means for generating, at a leader data storage device selected from the plurality of data storage devices, updated parity data based on an original version of the first section of the data set and the update data;

means for transmitting the updated parity data to the plurality of parity devices, the updated parity data being associated with a particular parity data subsection;

means for receiving update notifications from a plurality of parity devices, an update notification from a particular parity device indicating that the particular parity device has updated the parity data stored at the particular parity data, wherein updating the parity data includes replacing a subsection of the original parity data with the updated parity data;

means for determining that update notifications have been received from at least a threshold number of parity devices in the plurality of parity devices; and means for updating, responsive to determining that update notifications have been received from at least the threshold number of parity devices in the plurality of parity devices, the first section of the data set at the leader data storage device based on the update data.

15. The system of claim 14, wherein the threshold number of parity devices is based on a total number of parity devices in the plurality of parity devices.

16. The system of claim 14, wherein the threshold number of parity devices is a majority of parity devices in the plurality of parity devices.

17. The system of claim 14, wherein means for generating, at the leader data storage device, updated parity data further comprises:

means for combining the first section of the data set with the update data.

18. The system of claim 14, further comprising:

means for designating a particular data storage device associated with the first section of the data set as the leader data storage device.

19. The system of claim 18, wherein designating a particular data storage device associated with the first section of the data set as a leader data storage device further comprises:

identifying one or more data storage devices that store the first section of the data set; and selecting a data storage device from the one or more data storage devices that stores the first section of the data set as the leader data storage device.

20. The system of claim 14, wherein the original parity data is coded and can be used to validate the data set.

* * * * *